United States Patent
Xu et al.

(10) Patent No.: US 11,848,317 B2
(45) Date of Patent: Dec. 19, 2023

(54) LIGHT EMITTING SUBSTRATES AND DISPLAY DEVICES

(71) Applicants: Hefei BOE Ruisheng Technology Co., Ltd., Anhui (CN); BOE Technology Group Co., Ltd., Beijing (CN)

(72) Inventors: Wenjie Xu, Beijing (CN); Min He, Beijing (CN); Xiaodong Xie, Beijing (CN); Bin Pang, Beijing (CN); Huayu Sang, Beijing (CN); Xinxiu Zhang, Beijing (CN); Xue Zhao, Beijing (CN); Jing Wang, Beijing (CN)

(73) Assignees: HEFEI BOE RUISHENG TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/894,716

(22) Filed: Aug. 24, 2022

(65) Prior Publication Data
US 2023/0112742 A1 Apr. 13, 2023

Related U.S. Application Data

(63) Continuation of application No. PCT/CN2021/121919, filed on Sep. 29, 2021.

(51) Int. Cl.
*H01L 25/16* (2023.01)
*G09G 3/32* (2016.01)
*H01L 23/538* (2006.01)

(52) U.S. Cl.
CPC ............ *H01L 25/167* (2013.01); *G09G 3/32* (2013.01); *H01L 23/5386* (2013.01); *G09G 2300/0408* (2013.01)

(58) Field of Classification Search
CPC .......... G09G 3/32; G09G 2300/0408; H01L 25/167; H01L 23/5386
See application file for complete search history.

(56) References Cited

U.S. PATENT DOCUMENTS

2018/0314380 A1* 11/2018 Uehara ............... G06F 3/04166
2020/0110510 A1* 4/2020 Hoch .................... G06F 3/0446
(Continued)

FOREIGN PATENT DOCUMENTS

| CN | 108287436 A | 7/2018 |
| CN | 108873550 A | 11/2018 |

(Continued)

OTHER PUBLICATIONS

PCT/CN2021/121919 international search report.
PCT/CN2021/121919 Written Opinion.

*Primary Examiner* — Muhammad N Edun
(74) *Attorney, Agent, or Firm* — IPro, PLLC

(57) ABSTRACT

A light emitting substrate (100) and a display device are provided. The light emitting substrate (100) includes a light emitting region (110) and a border region (160). The light emitting substrate (100) includes a base (10), and a plurality of light emitting units (102) and a plurality of signal lines (30) located on the base (10). The light emitting units (102) are located in the light emitting region (110), and each includes a driving circuit (103) and at least one light emitting element (104). The plurality of light emitting units (102) are arranged into M rows along a first direction (D1) and into N columns along a second direction (D2) intersecting the first direction (D1). The plurality of signal lines (30) include N target signal lines (31) extending along the first direction (D1); the border region (160) includes a region of the light emitting substrate (100) located outside a first column of light emitting units (101), a region of the light emitting substrate (100) located outside an $N^{th}$ column of light (Continued)

emitting units (101), and a region of the light emitting substrate (100) located outside a first row of light emitting units. A target signal line (31) for the first column of light emitting units (101) and/or the $N^{th}$ column of light emitting units (101) include(s) a first extension section (311), a connection section (312) and a second extension section (313) connected in sequence. The first extension section (311) is connected with a driving circuit (103) and located in the border region (160). The first extension section (311), the connection section (312) and the second extension section (313) enclose a receiving region surrounding at least two groups of light emitting units (102).

20 Claims, 2 Drawing Sheets

(56) References Cited

U.S. PATENT DOCUMENTS

| | | |
|---|---|---|
| 2022/0123094 A1 | 4/2022 | Qiu et al. |
| 2022/0300114 A1 | 9/2022 | Wang et al. |

FOREIGN PATENT DOCUMENTS

| | | | |
|---|---|---|---|
| CN | 111326560 A | 6/2020 |
| CN | 111651087 A | 9/2020 |
| CN | 112435577 A | 3/2021 |
| CN | 112505964 A | 3/2021 |
| CN | 112864184 A | 5/2021 |
| CN | 113130463 A | 7/2021 |

\* cited by examiner

LIGHT EMITTING SUBSTRATES AND DISPLAY DEVICES

CROSS-REFERENCE TO RELATED APPLICATIONS

This application is a continuation application of international PCT Application No. PCT/CN2021/121919 filed on Sep. 29, 2021, the entire contents of which are incorporated herein by reference.

TECHNICAL FIELD

The present application relates to the field of optical technology, and in particular, to light emitting substrates and display devices.

BACKGROUND

Mini-LED is a novel LED display technology derived from small-spacing LED, and also known as sub-millimeter light emitting diode. The crystal grain size of Mini-LED is about 50 μm to 300 μm, which is between crystal grain sizes of conventional LED and Micro LED. Because Mini-LED has good display effect, thin and light feature, high contrast ratio, long service life and other advantages, its application trend in display field is significant.

SUMMARY

In a first aspect of embodiments of the present application, there is provided a light emitting substrate. The light emitting substrate includes: a light emitting region and a border region, where the light emitting substrate includes a base, and a plurality of light emitting units and a plurality of signal lines located on the base; the light emitting units are located in the light emitting region, and each of the light emitting units includes a driving circuit and at least one light emitting element connected with the driving circuit; the plurality of light emitting units are arranged into M rows along a first direction and into N columns along a second direction intersecting the first direction, where both M and N are positive integers greater than or equal to 1; the plurality of signal lines include N target signal lines extending along the first direction; the border region includes a region of the light emitting substrate located outside a first column of light emitting units, a region of the light emitting substrate located outside an $N^{th}$ column of light emitting units, and a region of the light emitting substrate located outside a first row of light emitting units; and a target signal line for the first column of light emitting units and/or a target signal line for the $N^{th}$ column of light emitting units include(s) a first extension section, a connection section and a second extension section connected in sequence; the first extension section is connected with a driving circuit and located in the border region; the first extension section, the connection section and the second extension section enclose a receiving region surrounding at least two groups of light emitting units.

In an embodiment, the border region includes a first border region, a second border region, and a third border region; the first border region and the second border region extend along the first direction and are oppositely arranged; the third border region extends along the second direction; the first border region is the region of the light emitting substrate located outside the first column of light emitting units; the second border region is the region of the light emitting substrate located outside the $N^{th}$ column of light emitting units; the third border region is the region of the light emitting substrate located outside the first row of light emitting units; and the first extension section is located in the second border region or the first border region, the connection section is located in the third border region, and the second extension section is located in the light emitting region, where a length of the first extension section is smaller than a length of the second extension section.

In an embodiment, the border region further includes a fourth border region arranged oppositely to the third border region; the fourth border region is a region of the light emitting substrate located outside an $M^{th}$ row of light emitting units; and the fourth border region includes a bonding region; the second extension section is connected with the bonding region.

In an embodiment, the light emitting region includes a plurality of sub-light emitting regions arranged along the second direction, and each of the sub-light emitting regions is provided with a plurality of columns of light emitting units; and the bonding region includes a plurality of sub-bonding regions, and signal lines in one sub-light emitting region are connected with one sub-bonding region.

In an embodiment, each of the sub-bonding regions is provided with bonding terminals for connection with corresponding sub-light emitting region, and a bonding terminal connected with the second extension section is located between bonding terminals corresponding to two sub-light emitting regions adjacent to a sub-light emitting region where the second extension section is located.

In an embodiment, the light emitting region includes a plurality of sub-light emitting regions arranged along the second direction, and each of the sub-light emitting regions is provided with a plurality of columns of light emitting units; driving circuits in one column of light emitting units are connected with one target signal line; and in a sub-light emitting region where the first column of light emitting units is located, each of at least two target signal lines encloses a receiving region surrounding at least two groups of light emitting units; and/or in a sub-light emitting region where the $N^{th}$ column of light emitting units is located, each of at least two target signal lines encloses a receiving region surrounding at least two groups of light emitting units.

In an embodiment, the light emitting region includes a plurality of sub-light emitting regions arranged along the second direction, and each of the sub-light emitting regions is provided with X columns of light emitting units, where X is an even number; and in a same sub-light emitting region, the second extension section is located between a $(X/2)^{th}$ column of light emitting units and a $(X/2+1)^{th}$ column of light emitting units.

In an embodiment, the light emitting region includes a plurality of sub-light emitting regions arranged along the second direction, and each of the sub-light emitting regions is provided with X columns of light emitting units, where X is a positive integer greater than or equal to 1; and in each of the sub-light emitting regions, the target signal line for the first column of light emitting units and/or a target signal line for an $X^{th}$ column of light emitting units enclose(s) a receiving region surrounding at least two groups of light emitting units.

In an embodiment, the border region includes a fanout region; at least one of the plurality of signal lines includes a bent portion extending along the first direction, and the bent portion is located in the fanout region; and an orthographic projection of a portion of the second extension section located in the fanout region in the second direction does not overlap an orthographic projection of the bent portion in the second direction.

In an embodiment, the target signal lines are connected with driving circuits in the first row of light emitting units.

In an embodiment, each driving circuit includes an address terminal and a relay terminal; the address terminal is configured to receive an address signal, and the relay terminal is configured to output a relay signal; respective driving circuits in each column of light emitting units are cascaded in sequence; the address terminal in an $i^{th}$ stage driving circuit is located on a side of the $i^{th}$ stage driving circuit close to an $(i-1)^{th}$ stage driving circuit, and the relay terminal in the $i^{th}$ stage driving circuit is located on a side of the $i^{th}$ stage driving circuit close to an $(i+1)^{th}$ stage driving circuit, where $1<i<M$ and i is a positive integer; and the first extension section is connected with the relay terminal of the driving circuit.

In an embodiment, the plurality of signal lines are arranged in a same layer.

In an embodiment, the light emitting substrate further includes a guard ring; the guard ring is located in the border region and surrounds a periphery of the light emitting region;

a distance between the connection section and the guard ring in the first direction is greater than or equal to 0.2 mm.

In an embodiment, the light emitting substrate further includes N driving voltage signal lines extending along the first direction, and one column of light emitting units is connected with one driving voltage signal line; and for each of the N driving voltage signal lines, spacing between the driving voltage signal line and other adjacent signal line is greater than or equal to 0.2 mm.

In an embodiment, the target signal lines are feedback signal lines; the second extension section is adjacent to a feedback signal line, and a distance between the second extension section and the adjacent feedback signal line in the second direction is greater than or equal to 0.05 mm.

In an embodiment, the light emitting substrate further includes N common voltage signal lines extending along the first direction, and driving circuits in one column of light emitting units are connected with one common voltage signal line; the border region includes a first border region and a second border region that are oppositely arranged; the first border region is the region of the light emitting substrate located outside the first column of light emitting units; the second border region is the region of the light emitting substrate located outside the $N^{th}$ column of light emitting units; and a common voltage signal line for the first column of light emitting units or the $N^{th}$ column of light emitting units includes a first connection portion located in the first border region or the second border region; each driving circuit includes a plurality of terminals; spacing between a geometric center of a plurality of terminals in a driving circuit in a column of light emitting units corresponding to the first connection portion and the first connection portion in the second direction is greater than or equal to 1.35 mm.

In an embodiment, the spacing between the geometric center of a plurality of terminals in a driving circuit in a column of light emitting units corresponding to the first connection portion and the first connection portion in the second direction is smaller than a size of light emitting units in the column of light emitting units in the second direction.

In an embodiment, the light emitting substrate further includes N common voltage signal lines extending along the first direction, and driving circuits in one column of light emitting units are connected with one common voltage signal line; the border region includes a first border region and a second border region that are oppositely arranged; the first border region is the region of the light emitting substrate located outside the first column of light emitting units; the second border region is the region of the light emitting substrate located outside the $N^{th}$ column of light emitting units; and a common voltage signal line for the first column of light emitting units or the $N^{th}$ column of light emitting units includes a first connection portion located in the first border region or the second border region; and a groove is provided on a side of the first connection portion facing the light emitting region.

In an embodiment, the light emitting substrate further includes N driving voltage signal lines extending along the first direction, and driving circuits in one column of light emitting units are connected with one driving voltage signal line; the border region includes a first border region and a second border region that are oppositely arranged; the first border region is the region of the light emitting substrate located outside the first column of light emitting units; the second border region is the region of the light emitting substrate located outside the $N^{th}$ column of light emitting units; and a driving voltage signal line for the first column of light emitting units or the $N^{th}$ column of light emitting units includes a second connection portion located in the first border region or the second border region; and a groove is provided on a side of the second connection portion facing the light emitting region.

In an embodiment, the target signal lines are feedback signal lines; the plurality of signal lines further include driving voltage signal lines, power signal lines, and common voltage signal lines; each driving circuit includes an address terminal, a relay terminal, a power supply terminal, and a common voltage terminal;

respective driving circuits in each column of light emitting units are cascaded in sequence; the address terminal in an $i^{th}$ stage driving circuit is located on a side of the $i^{th}$ stage driving circuit close to an $(i-1)^{th}$ stage driving circuit, and the relay terminal in the $i^{th}$ stage driving circuit is located on a side of the $i^{th}$ stage driving circuit close to an $(i+1)^{th}$ stage driving circuit, where $1<i<M$ and i is a positive integer; the first extension section of a feedback signal line is connected with the relay terminal in a last stage driving circuit; and in the second direction, for a column of light emitting units and signal lines connected with the column of light emitting units, a driving voltage signal line, light emitting elements, driving circuits, a power signal line, and a common voltage signal line are arranged in sequence.

In an embodiment, the target signal lines are feedback signal lines; the light emitting region includes a plurality of sub-light emitting regions, and each of the sub-light emitting regions is provided with four columns of light emitting units; in each of the sub-light emitting regions, a feedback signal line for a fourth column of light emitting units includes the first extension section, the connection section, and the second extension section connected in sequence; in a same sub-light emitting region, the second extension section is located on a side of a feedback signal line for a second column of light emitting units.

In an embodiment, the border region includes a fourth border region extending along the second direction; the fourth border region is a region of the light emitting substrate located outside an $M^{th}$ row of light emitting units; the fourth border region includes a plurality of sub-bonding regions; the light emitting region includes a plurality of sub-light emitting regions, and each of the sub-light emitting regions is provided with a plurality of columns of light emitting units; signal lines in one sub-light emitting region are connected with bonding terminals in a same sub-bonding region; the bonding terminals in the same sub-bonding region are connected with a flexible circuit board.

In a second aspect of the embodiments of the present application, there is provided a display device. The display device includes the above-described light emitting substrate.

In the light emitting substrate and the display device according to the embodiments of the present application, the target signal line for the first column of light emitting units and/or the target signal line for the $N^{th}$ column of light emitting units include(s) the first extension section, the connection section and the second extension section connected in sequence. Since the first extension section, the connection section and the second extension section enclose the receiving region surrounding at least two groups of light emitting units, the second extension section is at least partially located in the light emitting region, which, compared with a solution that the second extension section is disposed in a region of the border region located outside the first column of light emitting units or in a region of the border region located outside the $N^{th}$ column of light emitting units, can reduce a width of the border region, help to increase a proportion of the light emitting region in the light emitting substrate, and further improve user experience.

DETAILED DESCRIPTION OF THE EMBODIMENTS

Figure 1:
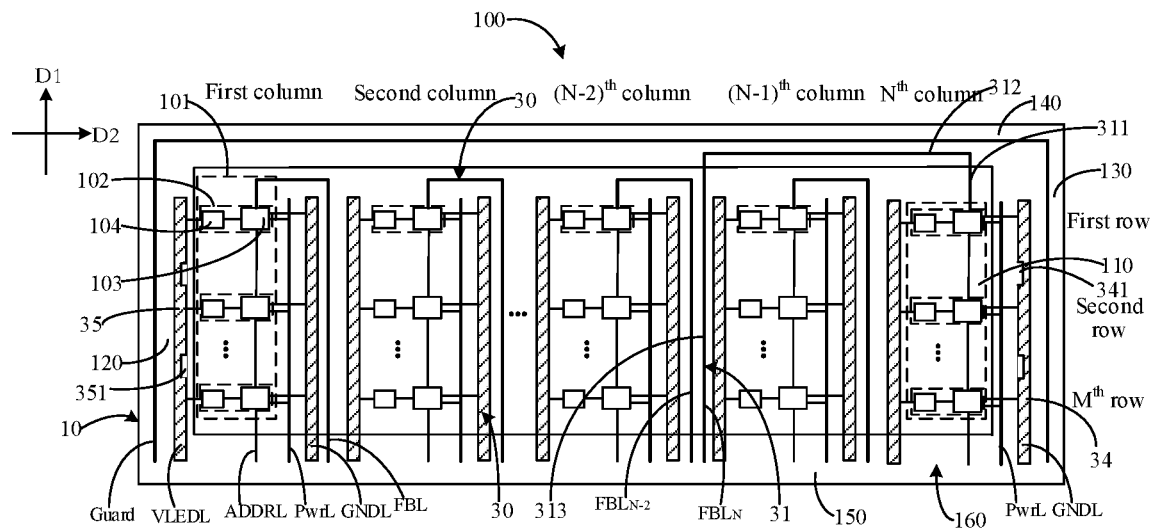
FIG. 1 is a schematic diagram illustrating an arrangement of a light emitting substrate according to an exemplary embodiment of the present application.

Examples will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present application. Rather, they are merely examples of apparatuses and methods consistent with some aspects of the present application as detailed in the appended claims.

The terms used in the present application are for the purpose of describing particular examples only, and are not intended to limit the present application. Terms determined by "a", "the" and "said" in their singular forms in the present application and the appended claims are also intended to include plurality, unless clearly indicated otherwise in the context. It should also be understood that the term "and/or" as used herein refers to and includes any and all possible combinations of one or more of the associated listed items.

It is to be understood that, although terms "first," "second," "third," and the like may be used in the present application to describe various information, such information should not be limited to these terms. These terms are only used to distinguish one category of information from another. For example, without departing from the scope of the present application, first information may be referred as second information; and similarly, the second information may also be referred as the first information. Depending on the context, the word "if" as used herein may be interpreted as "when" or "upon" or "in response to determining".

Embodiments of the present application provide a light emitting substrate and a display device. The light emitting substrate and the display device in the embodiments of the present application will be described in detail below with reference to the accompanying drawings. In a case of no conflict, features in the following embodiments can be supplemented or combined with each other.

An embodiment of the present application provides a light emitting substrate, and FIG. 1 is a schematic diagram illustrating an arrangement of a light emitting substrate 100. As shown in FIG. 1, the light emitting substrate 100 includes a light emitting region 110 and a border region 160.

The light emitting substrate 100 includes a base 10, and a plurality of light emitting units 102 and a plurality of signal lines 30 located on the base 10. The light emitting units 102 are located in the light emitting region 110, and each includes a driving circuit 103 and at least one light emitting element 104 connected with the driving circuit 103. The plurality of light emitting units 102 are arranged into M rows along a first direction D1 and into N columns along a second direction D2 intersecting the first direction D1, where both M and N are positive integers greater than or equal to 1. The first direction D1 can be a column direction in the drawings, and the second direction D2 can be a row direction in the drawings. The first direction D1 and the second direction D2 can be perpendicular to each other. The plurality of signal lines include N target signal lines extending along the first direction D1. The border region includes a region of the light emitting substrate 100 located outside a first column of light emitting units, a region of the light emitting substrate 100 located outside an $N^{th}$ column of light emitting units, and a region of the light emitting substrate 100 located outside a first row of light emitting units.

A target signal line 31 for the first column of light emitting units 101 and/or a target signal line 31 for the $N^{th}$ column of light emitting units 101 include(s) a first extension section 311, a connection section 312 and a second extension section 313 connected in sequence. The first extension section 311 is connected with a driving circuit 103 and located in the border region 160. The first extension section 311, the connection section 312 and the second extension section 313 enclose a receiving region. The receiving region surrounds at least two groups of light emitting units 102. The receiving region surrounding the at least two groups of light emitting units 102 can refer to the receiving region surrounding at least two light emitting units 102 arranged in the first direction D1, or the receiving region surrounding at least two light emitting units 102 arranged in the second direction D2, or the receiving region surrounding light emitting units that are located in at least two columns and at least two of which are located in a same column.

In the embodiment shown in FIG. 1, the target signal line 31 for the $N^{th}$ column of light emitting units 101 forms a receiving region, and the target signal line 31 for the first column of light emitting units 101 does not form a receiving region. In other embodiments, the target signal line 31 for the first column of light emitting units 101 forms a receiving region, and the target signal line 31 for the $N^{th}$ column of light emitting units 101 does not form a receiving region, or both the target signal line 31 for the first column of light emitting units 101 and the target signal line 31 for the $N^{th}$ column of light emitting units 101 form a receiving region.

In the light emitting substrate 100 according to the embodiments of the present application, the target signal line 31 for the first column of light emitting units 101 and/or the target signal line 31 for the $N^{th}$ column of light emitting units 101 include(s) the first extension section 311, the connection section 312 and the second extension section 313 connected in sequence. Since the first extension section 311, the connection section 312 and the second extension section 313 enclose the receiving region surrounding at least two groups of light emitting units, the second extension section is at least partially located in the light emitting region, which, compared with a solution that the second extension section 313 is disposed in a region of the border region located outside the first column of light emitting units 101 or in a region of the border region located outside the $N^{th}$ column of light emitting units 101, can reduce a width of the border region, help to increase a proportion of the light emitting region in the light emitting substrate, and further improve user experience.

In an embodiment, driving circuits 103 in one column of light emitting units 101 are connected with one target signal line 31. One column of light emitting units 101 corresponds to one target signal line 31, and each driving circuit 103 in this column of light emitting units 101 is connected with corresponding target signal line 31.

In an embodiment, as shown in FIG. 1, the border region 160 includes a first border region 120, a second border region 130, a third border region 140 and a fourth border region 150. The first border region 120 and the second border region 130 extend along the first direction D1 and are oppositely arranged. The third border region 140 and the fourth border region 150 extend along the second direction D2 and are oppositely arranged. The first border region 120 is the region of the light emitting substrate 100 located outside the first column of light emitting units 101. The second border region 130 is the region of the light emitting substrate 100 located outside the $N^{th}$ column of light emitting units 101. The third border region 140 is the region of the light emitting substrate 100 located outside the first row of light emitting units. The fourth border region 150 is a region of the light emitting substrate 100 located outside an $M^{th}$ row of light emitting units. In some embodiments, the first border region 120 is a left side border of the light emitting substrate, the second border region 130 is a right side border of the light emitting substrate, the third border region 140 is an upper side border of the light emitting substrate, and the fourth border region 150 is a lower side border of the light emitting substrate. The upper side, the lower side, the left side and the right side are determined by an orientation where each border of the light emitting substrate is located when a user uses the light emitting substrate. For example, a side of the light emitting substrate used for bonding a circuit board is a lower side of the light emitting substrate, and an upper side of the light emitting substrate is an opposite side of the lower side.

In an embodiment, the first extension section 311 is located in the second border region 130 or the first border region 120, the connection section 312 is located in the third border region 140, and the second extension section 313 is located in the light emitting region 110, where a length of the first extension section 311 is smaller than that of the second extension section 313. Moreover, the length of the first extension section 311 is much smaller than that of the second extension section 313. For example, the length of the first extension section 311 may be smaller than 1/M of the length of the second extension section 313. In some embodiments, M=30, and the length of the first extension section 311 may be smaller than 1/30 of the length of the second extension section 313. The connection section 312 may include a first portion extending along the second direction D2 and second portions extending along the first direction D1, where the second portions of the connection section 312 connect the first extension section 311 and the second extension section 313 with the first portion of the connection section 312.

Figure 2:
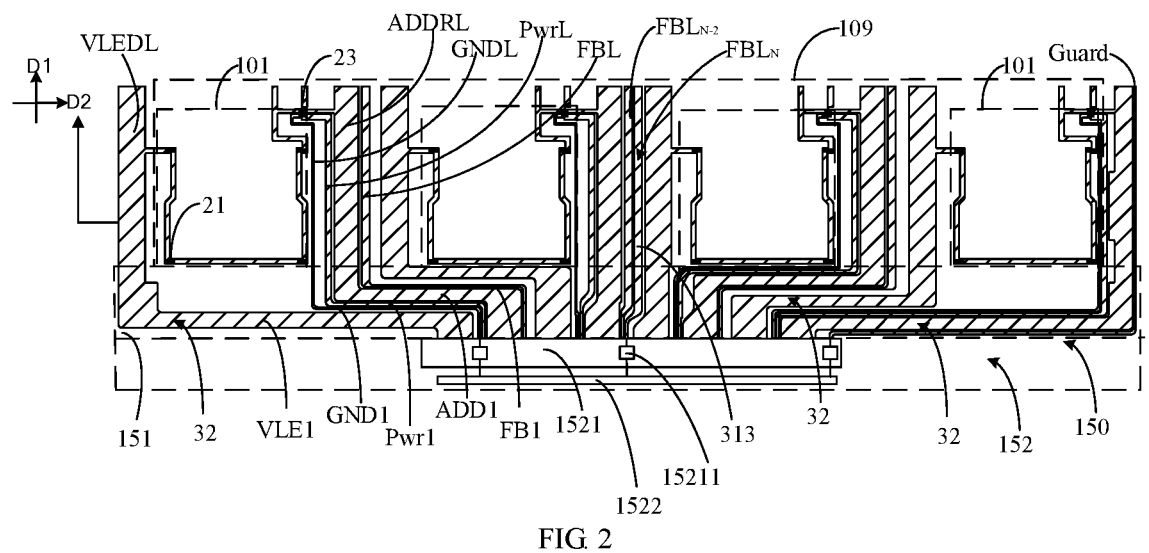
FIG. 2 is a schematic diagram illustrating a partial wiring of a light emitting substrate according to an exemplary embodiment of the present application.

In an embodiment, as shown in FIG. 2, the fourth border region 150 includes a fanout region 151 and a bonding region 152, and the fanout region 151 can be located between the bonding region 152 and the light emitting region 110. The second extension section 313 is connected with the bonding region 152. The second extension section 313 passes through the fanout region 151 and is connected with the bonding region 152.

In an embodiment, the light emitting region 110 includes a plurality of sub-light emitting regions 109 arranged along the second direction D2, and each of the sub-light emitting regions 109 is provided with a plurality of columns of light emitting units; the bonding region 152 includes a plurality of sub-bonding regions 1521, and signal lines 30 in one sub-light emitting region 109 are connected with one sub-bonding region 1521.

In an embodiment, each of the sub-bonding regions 1521 is provided with one or more bonding terminals 15211 for connection with corresponding sub-light emitting region 109, and the second extension section 313 passes through the fanout region 151 and is connected with a bonding terminal in the bonding region 152. Bonding terminals in the bonding region 152 can be bonded with a circuit board 1522. The circuit board provides electrical signals for signal lines 30 connected with the bonding terminals.

In an embodiment, the signal lines 30 in one sub-light emitting region 109 are connected with one or more bonding terminals in a same sub-bonding region 1521. The one or more bonding terminals in the same sub-bonding region 1521 are connected with a flexible circuit board. The flexible circuit board provides corresponding electrical signals for signal lines.

In some embodiments, as shown in FIG. 2, a width of each sub-light emitting region 109 in the second direction D2 is greater than a width of corresponding sub-bonding region 1521 in the second direction D2. A distance between an end of the sub-light emitting region 109 close to the first border region and an end of corresponding sub-bonding region 1521 close to the first border region is roughly the same as a distance between an end of the sub-light emitting region 109 close to the second border region and an end of corresponding sub-bonding region 1521 close to the second border region.

When at least a part of signal lines in a sub-light emitting region 109 pass through the fanout region 151 and are connected with a sub-bonding region 1521, due to for each of the at least a part of signal lines, a larger distance between a portion of the signal line located in the light emitting region and corresponding sub-bonding region in the second direction D2, the signal line may bend in the fanout region. Especially, distances from signal lines for a column of light emitting units 101 close to the first border region 120 and signal lines for a column of light emitting units 101 close to the second border region 130 in the sub-light emitting region 109 to corresponding bonding terminals in the second direction D2 are larger, these signal lines 30 are more likely to bend when passing through the fanout region 151.

In an embodiment, as shown in FIG. 2, at least one of the plurality of signal lines 30 in the light emitting substrate 100 includes a bent portion 32 extending along the first direction D1. The bent portion 32 extending along the first direction D1 refers to the bent portion 32 generally extending along the first direction D1.

When projections of a plurality of bent portions 32 in the fanout region 151 in the second direction overlap, a width of the fanout region 151 in the second direction D2 may be larger. When a width of the fourth border region 150 is constant, a width of the bent portions 32 needs to be set smaller, consequently a resistance of the bent portions 32 is larger, and a temperature rise of the fanout region 151 is larger during the working of the light emitting substrate. The projections of the bent portions 32 in the second direction D2 refer to projections of the bent portions 32 on a straight line extending along the second direction D2.

In the embodiments of the present application, by disposing the target signal line 31 for the first column of light emitting units 101 and/or the target signal line 31 for the $N^{th}$ column of light emitting units 101 that include(s) the first extension section 311, the connection section 312 and the second extension section 313 connected in sequence, a distance between a portion of the second extension section 313 located in the light emitting region and corresponding sub-bonding region in the second direction D2 can be reduced, and the second extension section 313 may not bend when passing through the fanout region, or a size of a bent portion of the second extension section 313 in the second direction D2 is smaller, which helps to avoid a projection of a portion of the second extension section 313 located in the fanout region from overlapping a projection of a bent portion of other signal line in the second direction; on the premise that the width of the fourth border region is constant, a width of the bent portion of other signal line can be set larger to reduce the temperature rise of the fanout region 151 during the working of the light emitting substrate; on the premise that a width of a bent portion of each signal line and a distance between adjacent bent portions are constant, it is helpful to reduce the width of the fourth border region.

In an embodiment, a bonding terminal connected with the second extension section 313 is located between bonding terminals corresponding to two sub-light emitting regions 109 adjacent to a sub-light emitting region 109 where the second extension section 313 is located. A bonding terminal corresponding to a sub-light emitting region 109 refers to a bonding terminal connected with a signal line in the sub-light emitting region 109. Two sub-light emitting regions adjacent to a sub-light emitting region 109 refer to two sub-light emitting regions on two sides of the sub-light emitting region 109. With such configuration, a distance between a portion of the second extension section 313 located in the light emitting region and corresponding bonding terminal in the second direction D2 is smaller, which is helpful for a portion of the second extension section 313 located in the fanout region to bend. Therefore, on the premise that the width of the fourth border region is constant, the temperature rise of the fanout region during the working of the light emitting substrate can be further reduced; on the premise that a width of a bent portion of each signal line and a distance between adjacent bent portions are constant, the width of the fourth border region can be further reduced.

In an embodiment, in a sub-light emitting region 109 where the first column of light emitting units 101 is located, each of at least two target signal lines 31 encloses a receiving region surrounding at least two groups of light emitting units 102. With such configuration, on the premise that the width of the fourth border region is constant, it is more helpful to increase a width of a bent portion of a signal line in the fanout region to further reduce the temperature rise of the fanout region during the working of the light emitting substrate; on the premise that a width of a bent portion of each signal line and a distance between adjacent bent portions are constant, the width of the fourth border region can be more effectively reduced.

In an embodiment, in a sub-light emitting region 109 where the $N^{th}$ column of light emitting units 101 is located, each of at least two target signal lines 31 encloses a receiving region surrounding at least two groups of light emitting units. With such configuration, it is more helpful to reduce the width of the fourth border region 150. Therefore, on the premise that the width of the fourth border region is constant, it is more helpful to increase a width of a bent portion of a signal line in the fanout region to further reduce the temperature rise of the fanout region during the working of the light emitting substrate; on the premise that a width of a bent portion of each signal line and a distance between adjacent bent portions are constant, the width of the fourth border region can be more effectively reduced.

In an embodiment, referring to FIG. 2 again, the light emitting region 110 includes a plurality of sub-light emitting regions 109 arranged along the second direction D2, and each of the sub-light emitting regions 109 is provided with X columns of light emitting units, where X is an even number. In a same sub-light emitting region 109, the second extension section 313 is located between a $(X/2)^{th}$ column of light emitting units and a $(X/2+1)^{th}$ column of light emitting units. With such configuration, a distance between a second extension section 313 in each sub-light emitting region 109 and a center of corresponding sub-bonding region is closer. Therefore, each second extension section 313 can be connected with a bonding terminal in corresponding sub-bonding region without bending when passing through the fanout region 151, or each second extension section 313 bends in the fanout region 151, but a size of a bent portion in the second direction D2 is smaller, which helps to avoid a projection of the second extension section 313 in the second direction D2 from overlapping a projection of a bent portion 32 of other signal line in the second direction D2, and reduce the width of the fourth border region 150 or the temperature rise of the fanout region during the working of the light emitting substrate.

Figure 3:
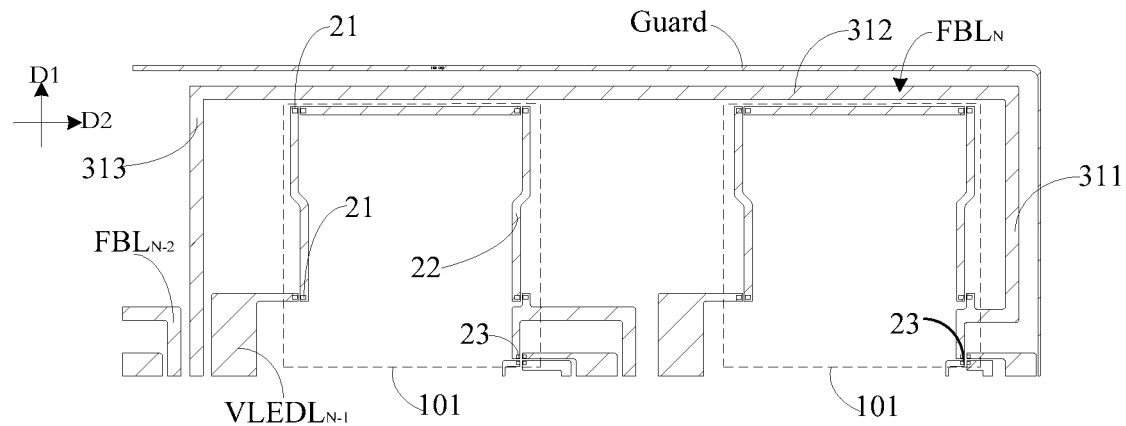
FIG. 3 is a schematic diagram illustrating a partial wiring of a light emitting substrate according to an exemplary embodiment of the present application.

In an exemplary embodiment, as shown in FIG. 2, X=4, that is, the light emitting region 110 includes a plurality of sub-light emitting regions 109, and each of the sub-light emitting regions 109 is provided with four columns of light emitting units; in each sub-light emitting region 109, a second extension section 313 for a fourth column of light emitting units is located between a second column of light emitting units and a third column of light emitting units. As shown in FIG. 2 and FIG. 3, two columns of light emitting units are disposed between a second extension section 313 and a first extension section 311.

In another embodiment, X is an odd number. In a same sub-light emitting region 109, a second extension section 313 is located between a $((X+1)/2)^{th}$ column of light emitting units and a $((X+1)/2+1)^{th}$ column of light emitting units. With such configuration, it is helpful to reduce the width of the fourth border region 150 or the temperature rise of the fanout region during the working of the light emitting substrate.

In an embodiment, each sub-light emitting region is provided with X columns of light emitting units, where X is a positive integer greater than or equal to 1; in each sub-light emitting region, a target signal line for a first column of light emitting units and/or a target signal line for an $X^{th}$ column of light emitting units enclose(s) a receiving region surrounding at least two groups of light emitting units. With such configuration, in each sub-light emitting region, distances from a portion of a second extension section for the first column of light emitting units located in the light emitting region and a portion of a second extension section for the $X^{th}$ column of light emitting units located in the light emitting region to corresponding bonding terminals in the second direction are smaller, which is more helpful to reduce the width of the fourth border region 150 or the temperature rise of the fanout region during the working of the light emitting substrate.

Further, when X is an even number, in each sub-light emitting region 109, a target signal line 31 for a first column of light emitting units 101 and a target signal line 31 for an $X^{th}$ column of light emitting units respectively enclose a receiving region surrounding at least two groups of light emitting units, and both a second extension section of the target signal line 31 for the first column of light emitting units 101 and a second extension section of the target signal line 31 for the $X^{th}$ column of light emitting units are located between a $(X/2)^{th}$ column of light emitting units and a $(X/2+1)^{th}$ column of light emitting units.

In an embodiment, as shown in FIG. 2, an orthographic projection of a portion of the second extension section 313 located in the fanout region 151 in the second direction D2 does not overlap an orthographic projection of the bent portion 32 in the second direction D2. With such configuration, the width of the fourth border region 150 or the temperature rise of the fanout region during the working of the light emitting substrate can be effectively reduced.

In an embodiment, the target signal lines 31 are connected with driving circuits for a first row of light emitting units. Distances between the driving circuits for the first row of light emitting units and the third border region 140 in the first direction D1 are smaller, so that a length of first extension sections 311 is smaller.

In an embodiment, the driving circuits 103 may be integrated circuits, especially be packaged chips with a plurality of terminals. Each driving circuit 103 may include one output terminal, or at least two output terminals, for example, two output terminals, three output terminals, four output terminals, or more output terminals.

Figure 4:
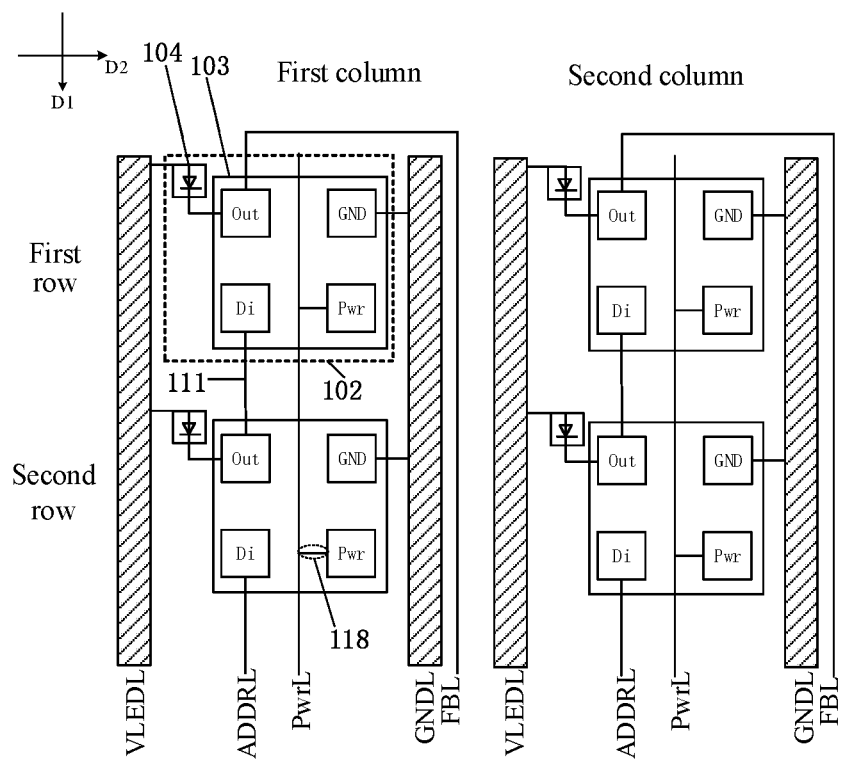
FIG. 4 is a schematic diagram illustrating a partial wiring of a light emitting substrate according to an exemplary embodiment of the present application.

In an embodiment, as shown in FIG. 4, each driving circuit 103 includes a plurality of terminals arranged in an array along the first direction D1 and the second direction D2, and the plurality of terminals are arranged into at least two columns along the second direction D2. The plurality of terminals include at least one output terminal Out and at least one common voltage terminal GND. The at least one output terminal Out and the at least one common voltage terminal GND are located in different columns of the plurality of terminals. In each column of light emitting units 101, for each of driving circuits 103, at least one output terminal Out in the driving circuit 103 is in one-to-one connection with at least one light emitting element 104 connected with the driving circuit 103, so as to transmit driving signals to the at least one light emitting element 104.

Each driving circuit 103 further includes an address terminal Di, a relay terminal Out, and a power supply terminal Pwr. Respective driving circuits 103 in each column of light emitting units 101 are cascaded in sequence. The address terminal Di in an $i^{th}$ stage driving circuit 103 is located on a side of the $i^{th}$ stage driving circuit 103 close to an $(i-1)^{th}$ stage driving circuit 103, and the relay terminal Out in the $i^{th}$ stage driving circuit 103 is located on a side of the $i^{th}$ stage driving circuit 103 close to an $(i+1)^{th}$ stage driving circuit 103, where 1<i<M and i is a positive integer. In a same column of light emitting units, two adjacent driving circuits 103 are cascaded in sequence through a cascaded wiring 111 extending along the first direction D1.

In the embodiments of the present application, respective driving circuits 103 in each column of light emitting units 101 are cascaded in sequence in a direction from the bottom up along the first direction D1. The $i^{th}$ stage driving circuit 103 refers to an $i^{th}$ driving circuit 103 counted upward from an $M^{th}$ row of driving circuits 103 in each column of light emitting units 101. Taking a first column of light emitting units 101 as an example, a driving circuit 103 located in an $M^{th}$ row of the first column is a first stage driving circuit, and a driving circuit 103 located in an $(M-1)^{th}$ row of the first column is a second stage driving circuit. By analogy, a driving circuit 103 located in a second row of the first column is an $(M-1)^{th}$ stage driving circuit, and a driving circuit 103 located in a first row of the first column is an $M^{th}$ stage driving circuit.

For driving circuits 103 shown in FIG. 4, each driving circuit 103 includes one output terminal Out, one common voltage terminal GND, one address terminal Di, and one power supply terminal Pwr. In the driving circuit 103, the output terminal Out also serves as a relay terminal, that is, the output terminal Out and the relay terminal are the same terminal. The output terminal Out outputs different signals respectively within different time periods, for example, the output terminal Out serves as a relay terminal to output relay signals and an output terminal to output driving signals, respectively.

In an embodiment, as shown in FIG. 4, a plurality of terminals in each driving circuit 103 are arranged into a first column and a second column along the second direction D2. In each column of light emitting units 101, a first column of terminals in the driving circuits 103 is located on a side of the driving circuits 103 close to the first border region 120 (i.e., on a left side of the driving circuits 103), and a second column of terminals in the driving circuits 103 is located on a side of the driving circuits 103 away from the first border region 120 (i.e., on a right side of the driving circuits 103). Such arrangement of terminals in the driving circuits 103 is beneficial to promote a regular arrangement of signal lines, so that the signal lines do not overlap each other, which avoids short circuit/open circuit or signal crosstalk caused by overlapping between the signal lines. In the embodiment shown in FIG. 4, for each column of light emitting units 101, output terminals Out and address terminals Di are located in a first column, and power supply terminals Pwr and common voltage terminals GND in driving circuits 103 are located in a second column. In other embodiments, numbers and arrangements of terminals in driving circuits 103 may be different.

In an embodiment, as shown in FIG. 2 and FIG. 3, the light emitting substrate further includes a plurality of first pads 23, and driving circuits 103 are mounted on the first pads 23 and are electrically connected with the first pads 23, where the first pads correspond to the driving circuits one to one. In the embodiment shown in FIG. 2 and FIG. 3, each first pad includes four sub-pads at positions corresponding to four terminals in the driving circuit 103, which are a first sub-pad for mounting of an address terminal Di, a second sub-pad for mounting of a power supply terminal Pwr, a third sub-pad for mounting of a common voltage terminal GND, and a fourth sub-pad for mounting of an output terminal Out. The first sub-pad is connected with the address terminal Di in the driving circuit 103. The second sub-pad is connected with the power supply terminal Pwr in the driving circuit 103. The third sub-pad is connected with the common voltage terminal GND in the driving circuit 103. The fourth sub-pad is connected with the output terminal Out in the driving circuit 103. An end of the fourth sub-pad is connected with a cascaded wiring 111, so as to output a relay signal within a time period as an address signal of a next stage driving circuit 103 cascaded with the driving circuit 103. Another end of the fourth sub-pad is connected with a light emitting element 104, so as to transmit an electrical signal to the at least one light emitting element 104 connected with the driving circuit 103 within another time period.

In an embodiment, as shown in FIG. 2 and FIG. 3, the light emitting substrate further includes a plurality of second pads 21, which correspond to light emitting elements 104 one to one, and the light emitting elements 104 are mounted on corresponding second pads 21 and are electrically connected with the corresponding second pads. Each second pad includes two fifth sub-pads, and each light emitting element includes two terminals, where one terminal is electrically connected with one fifth sub-pad. When the light emitting unit 102 includes a plurality of light emitting elements 104, the second pads 21 connected with the plurality of light emitting elements 104 are connected with each other in series sequentially through a conducting wire 22.

In an embodiment, as shown in FIG. 1 to FIG. 4, the plurality of signal lines include N driving voltage signal lines VLEDL extending along the first direction D1, and one column of light emitting units is connected with one driving voltage signal line VLEDL. In an embodiment, an end of each light emitting element 104 in one column of light emitting units is connected with the driving voltage signal line VLEDL. When a light emitting unit includes a plurality of light emitting elements, the plurality of light emitting elements are connected in series through a conducting wire 22. In the plurality of light emitting elements that are connected in series, a terminal of a light emitting element located at one end is connected with the driving voltage signal line VLEDL through a second pad 21, and a terminal of a light emitting element located on the other end is connected with an output terminal Out in a driving circuit through a second pad 21. The driving voltage signal line VLEDL is configured to provide a driving voltage to the light emitting elements 104. In each column of light emitting units 101, for each of driving circuits 103, an output terminal Out in the driving circuit 103 is connected with a second end of at least one light emitting element 104 connected with the driving circuit 103, so as to transmit a driving signal to the at least one light emitting element 104.

In an embodiment, as shown in FIG. 1 to FIG. 4, the plurality of signal lines further include N common voltage signal lines GNDL extending along the first direction D1, and one column of light emitting units is connected with one common voltage signal line GNDL. In an embodiment, each driving circuit 103 in one column of light emitting units is connected with the common voltage signal line GNDL. The third sub-pad is connected with the common voltage signal line GNDL to transmit a common voltage signal on the common voltage signal line GNDL to the common voltage terminal GND. The common voltage signal line GNDL is configured to provide a common voltage (e.g., a ground voltage) to driving circuits 103. For example, when a light emitting element 104 in a light emitting unit 102 is required to emit light, by setting a driving voltage to be a high voltage and a common voltage to be a low voltage, a voltage difference between two sides of the light emitting element 104 is generated, thereby driving the light emitting element 104 to emit light.

When a light emitting unit 102 includes a plurality of light emitting elements 104 that are connected in series, a fifth sub-pad corresponding to one of the light emitting elements 104 is connected with an output terminal Out in a driving circuit 103. A common voltage terminal GND in each driving circuit 103 is connected with a common voltage signal line GNDL to receive a common voltage (e.g., a ground voltage) transmitted by the common voltage signal line GNDL.

In an embodiment, as shown in FIG. 1 to FIG. 4, the plurality of signal lines further include N address signal lines ADDRL extending along the first direction D1, and one column of light emitting units is connected with one address signal line ADDRL. The address signal line ADDRL is connected with an address terminal Di in a first stage driving circuit 103 through a first sub-pad, and a relay terminal Out in a driving circuit is connected with an address terminal Di in a next stage driving circuit 103 through a cascaded wiring. The address signal line ADDRL is configured to transmit an address signal to an address terminal Di in a first stage driving circuit 103 in each column of light emitting units. The first stage driving circuit 103, after receiving the address signal, can parse the address signal, and acquire and store address information in the address signal, so that the address information in the address signal can be used as address information of the first stage driving circuit 103. And the first stage driving circuit 103 can increment the address information by 1 or by another fixed amount, and modulate the incremented address information (new address information) into a relay signal. A relay terminal Out in the first stage driving circuit 103 transmits the relay signal to an address terminal Di in a second stage driving circuit 103 through a cascaded wiring, so that the relay signal can be used as address information of the second stage driving circuit 103. In other embodiments, the first stage driving circuit 103 can use any other appropriate function to transform its address information to generate a relay signal. The second stage driving circuit 103 transmits the relay signal to a third stage driving circuit 103 in a similar manner, so that the relay signal can be used as address information of the third stage driving circuit 103, and so on. In this way, corresponding address information can be configured for each of a plurality of cascaded driving circuits 103 in each column of light emitting units. For a column of light emitting units, only one address signal line ADDRL needs to be adopted to provide one address signal, and all driving circuits 103 in the column of light emitting units can acquire their respective address information. This greatly reduces a number of signal lines, saves wiring space, and simplifies control methods.

In an embodiment, as shown in FIG. 1 to FIG. 4, the plurality of signal lines further include N power signal lines PwrL extending along the first direction D1, and one column of light emitting units is connected with one power signal line PwrL. In an embodiment, one power signal line PwrL is connected with power supply terminals Pwr in all driving circuits 103 in corresponding column of light emitting units. A second sub-pad is connected with the power signal line PwrL to transmit a supply voltage signal on the power signal line PwrL to a power supply terminal Pwr. As shown in FIG. 4, each power signal line PwrL includes a main body portion and third connection portions 118. The main body portion of the power signal line PwrL extends along the first direction D1, and the power signal line PwrL is electrically connected with driving circuits 103 through the third connection portions 118.

The power signal line PwrL is configured to, for each of driving circuits 103 in a column of light emitting units, transmit a supply voltage signal to a power supply terminal Pwr in the driving circuit 103, thereby providing the supply voltage signal to the driving circuit 103. In an exemplary embodiment, the supply voltage signal is a power line carrier communication signal. In this case, for each of driving circuits 103 in a column of light emitting units, the power signal line PwrL can provide not only a supply voltage signal but also communication data for the driving circuit 103, where the communication data can be used to control a light emitting duration of at least one light emitting element 104 connected with the driving circuit 103, and thus its visual light emitting brightness. The power line carrier communication signal includes information corresponding to the communication data. For example, the communication data is data reflecting the light emitting duration, and further represents a required light emitting brightness. Compared with a conventional Serial Peripheral Interface (SPI) protocol, in the embodiments of the present application, by adopting a Power Line Carrier Communication (PLC) protocol, the communication data is also transmitted on the power signal line PwrL, so as to effectively reduce a number of signal lines.

In an embodiment, as shown in FIG. 1 to FIG. 4, the plurality of signal lines further include N feedback signal lines FBL extending along the first direction D1, and one column of light emitting units is connected with one feedback signal line FBL. In an embodiment, one feedback signal line FBL is connected with relay terminals Out in all driving circuits 103 in corresponding column of light emitting units. In each column of light emitting units 101, the feedback signal line FBL is connected with a relay terminal Out in a last stage driving circuit 103.

It should be noted that, in the embodiments of the present application, a signal line usually includes a main body portion and connection portions, where the main body portion defines a main extension direction of the signal line, and the connection portions are used to connect the signal line with light emitting units. In the embodiments of the present application, description such as "a signal line X extending along the first direction D1" defines only that a main portion of the signal line X extends along the first direction D1, but does not define that connection portions of the signal line X extend along the first direction D1. For example, the main body portion of each power signal line PwrL extends along the first direction D1, and the third connection portions 118 of the power signal line PwrL extend along a direction intersecting the first direction D1 (e.g., the second direction D2) instead of along the first direction D1.

In an embodiment, as shown in FIG. 1 to FIG. 3, the light emitting substrate 100 further includes a guard ring Guard, where the guard ring Guard is located in the border region 160 and surrounds a periphery of the light emitting region 110. An electrical signal received by the guard ring Guard may be the same as an electrical signal received by the common voltage signal line GNDL. For example, both the guard ring Guard and the common voltage signal line GNDL are connected with bonding terminals in the bonding region, and bonding terminals connected with the guard ring Guard and bonding terminals connected with the common voltage signal line GNDL have a same electrical signal, so that the electrical signal received by the guard ring Guard is the same as the electrical signal received by the common voltage signal line GNDL.

In an embodiment, a distance between the connection section 312 and the guard ring Guard in the first direction D1 is greater than or equal to 0.2 mm. The distance between the connection section 312 and the guard ring Guard in the first direction D1 refers to a distance between a portion of the connection section 312 extending along the second direction and the guard ring Guard in the first direction D1. With such configuration, it is helpful to avoid signal interference between a target signal line 31 and the guard ring Guard.

In an embodiment, the target signal line 31 is a feedback signal line FBL. A first extension section 311 of the feedback signal line FBL is connected with a relay terminal Out of a last stage driving circuit 103.

Further, as shown in FIG. 1 and FIG. 2, in the second direction D2, for a column of light emitting units 102 and signal lines connected with the column of light emitting units 102, a driving voltage signal line VLEDL, light emitting elements 104, driving circuits 103, a power signal line PwrL and a common voltage signal line GNDL are arranged in sequence. A first extension section 311 of the feedback signal line FBL is located between a driving voltage signal line VLEDL and a power signal line PwrL for a column of light emitting units which the feedback signal line FBL is connected with.

Further, a second extension section 313 of the feedback signal line FBL is adjacent to another feedback signal line FBL, and a distance between the second extension section 313 and the adjacent feedback signal line FBL in the second direction D2 is greater than or equal to 0.05 mm. The second extension section 313 may be located between a feedback signal line FBL for a column of light emitting units and a driving voltage signal line VLEDL for a next column of light emitting units. As shown in FIG. 3, a second extension section 313 of a feedback signal line $FBL_N$ for an $N^{th}$ column of light emitting units is located between a feedback signal line $FBL_{N-2}$ for an $(N-2)^{th}$ column of light emitting units and a driving voltage signal line $VLEDL_{N-1}$ for an $(N-1)^{th}$ column of light emitting units. By setting the distance between the second extension section 313 and the adjacent feedback signal line FBL in the second direction D2 to be greater than or equal to 0.05 mm, signal crosstalk between the second extension section 313 and the adjacent feedback signal line FBL can be avoided.

In an embodiment, spacing between a driving voltage signal line and other adjacent signal line(s) is greater than or equal to 0.2 mm. This is because a voltage on the driving voltage signal line VLEDL is higher (for example, about 10~50V), and a voltage on other signal line(s) adjacent to the driving voltage signal line VLEDL is usually lower. If the spacing is too small, it is easy to cause adverse phenomena such as line breakdown.

In an embodiment, as shown in FIG. 1, the common voltage signal line GNDL in the first column of light emitting units or the $N^{th}$ column of light emitting units includes a first connection portion 34 located in the first border region 120 or the second border region 130; spacing between a geometric center of a plurality of terminals in a driving circuit in a column of light emitting units corresponding to the first connection portion 34 and the first connection portion 34 in the second direction D2 is greater than or equal to 1.35 mm. The geometric center of a plurality of terminals in a driving circuit refers to a center of a shape formed by connecting the plurality of terminals in sequence. In the embodiment shown in FIG. 1, the first connection portion 34 is located in the second border region 130. In other embodiments, the first connection portion 34 may be located in the first border region 120.

The light emitting substrate further includes a protective resin covering driving circuits. If the protective resin covers common voltage signal lines GNDL, the protective resin expands with heat and contracts with cold during a reliability test of the light emitting substrate, which is easy to cause the common voltage signal lines GNDL to peel off adjacent film layers, affecting the reliability of the light emitting substrate. By setting the spacing between the first connection portion 34 and the geometric center of a plurality of terminals in corresponding driving circuit in the second direction D2 to be greater than or equal to 1.35 mm, it is helpful to avoid the first connection portion 34 from peeling off the adjacent film layers caused by the protective resin covering the first connection portion 34, which can improve the reliability of the light emitting substrate. Besides, by setting the spacing between the first connection portion 34 and the geometric center of a plurality of terminals in corresponding driving circuit in the second direction D2 to be greater than or equal to 1.35 mm, there is no need to provide, on the first connection portion 34, a groove facing the light emitting region 110, which can effectively avoid the protective resin from covering the first connection portion 34. Therefore, a width of the first connection portion 34 can be set smaller, which can further reduce a width of a border region where the first connection portion 34 is located.

Further, the spacing between the geometric center of a plurality of terminals in a driving circuit in a column of light emitting units corresponding to the first connection portion 34 and the first connection portion 34 in the second direction is smaller than a size of light emitting units in the column of light emitting units in the second direction D2. With such configuration, it can be avoided that the spacing between the first connection portion 34 and the geometric center of a plurality of terminals in a driving circuit is too large, so that a density of light emitting units in the light emitting substrate can be avoided from being smaller.

In an embodiment, a groove 341 is provided on a side of the first connection portion 34 facing the light emitting region 110. With such configuration, it is helpful to avoid the first connection portion 34 from peeling off the adjacent film layers caused by the protective resin covering the first connection portion 34, which can improve the reliability of the light emitting substrate.

In an embodiment, as shown in FIG. 1, a driving voltage signal line VLEDL for the first column of light emitting units or the $N^{th}$ column of light emitting units includes a second connection portion 35 located in the first border region 120 or the second border region 130. A groove 351 is provided on a side of the second connection portion 35 facing the light emitting region 110. With such configuration, it is helpful to avoid the second connection portion 35 from peeling off adjacent film layers caused by the protective resin covering the second connection portion 35, which can improve the reliability of the light emitting substrate. In the embodiment shown in FIG. 1, the second connection portion 35 is located in the first border region 120. In other embodiments, the second connection portion 35 may be located in the second border region 130.

In an embodiment, as shown in FIG. 2, the light emitting region 110 includes a plurality of sub-light emitting regions 109, and each sub-light emitting region 109 is provided with four columns of light emitting units 101; in each sub-light emitting region 109, a feedback signal line for a fourth column of light emitting units includes a first extension section 311, a connection section 312 and a second extension section 313 connected in sequence. In a same sub-light emitting region 109, the second extension section 313 is located on a side of a feedback signal line FBL for a second column of light emitting units. With such configuration, orthographic projections of a portion of the second extension section 313 and a portion of the feedback signal line FBL for the second column of light emitting units located in the fanout region 151 in the second direction D2 do not overlap orthographic projections of bent portions 32 of other signal lines in the second direction D2, which reduces the width of the fourth border region 150 or the temperature rise of the fanout region during the working of the light emitting substrate. In the embodiment shown in FIG. 2, in a same sub-light emitting region 109, a feedback signal line FBL for a first column of light emitting units, a feedback signal line FBL for a second column of light emitting units, and a feedback signal line FBL for a third column of light emitting units bend to a side of common voltage signal lines GNDL for the columns of light emitting units corresponding to these feedback signal lines FBL away from the first border region 120.

In the embodiment shown in FIG. 2, among signal lines in a same sub-light emitting region, orthographic projections of a portion of the second extension section 313 and a portion of the feedback signal line FBL for the second column of light emitting units located in the fanout region 151 in the second direction D2 do not overlap an orthographic projection of a bent portion VLE1 of a driving voltage signal line VLEDL in the second direction D2, an orthographic projection of a bent portion GND1 of a common voltage signal line GNDL in the second direction D2, an orthographic projection of a bent portion Pwr1 of a power signal line PwrL in the second direction D2, an orthographic projection of a bent portion ADD1 of an address signal line ADDRL in the second direction D2, or an orthographic projection of a bent portion FB1 of other feedback signal line FBL in the second direction.

In an exemplary embodiment, if a feedback signal line FBL is bent to a side of a common voltage signal line GNDL for a column of light emitting units corresponding to the feedback signal line FBL away from the first border region 120, and the feedback signal line FBL includes a bent portion located in the fanout region, in order to prevent signal crosstalk, a distance between a bent portion FB1 of the feedback signal line FBL and a bent portion GND1 of an adjacent common voltage signal line GNDL in the first direction needs to be greater than or equal to 0.1 mm, a distance between the bent portion FB1 of the feedback signal line FBL and a bent portion of an adjacent guard ring in the fanout region in the first direction needs to be greater than or equal to 0.2 mm, and a size of the bent portion FB1 of the feedback signal line in the first direction is greater than or equal to 0.11 mm.

In each sub-light emitting region, by arranging the second extension section 313 of a feedback signal line FBL for a fourth column of light emitting units to be located at a side of the feedback signal line FBL for the second column of light emitting units, a projection of a portion of the feedback signal line FBL for the fourth column of light emitting units located in the fanout region 151 and projections of bent portions of other signal lines in the second direction will not overlap each other. A total width reduced in the fourth border region is a sum of a distance between the bent portion of the feedback signal line FBL for the fourth column of light emitting units and the bent portion GND1 of an adjacent common voltage signal line GNDL in the first direction, a distance between the bent portion of the feedback signal line FBL for the fourth column of light emitting units and the bent portion of an adjacent guard ring Guard in the fanout region in the first direction, and the size of the bent portion FB1 of the feedback signal line in the first direction. The total width is greater than or equal to 0.41 mm.

The width reduced in the fourth border region can be used to increase a width of a current signal line, for example, widths of a driving voltage signal line VLEDL and a common voltage signal line GNDL. In an exemplary embodiment, a width of a bent portion of the driving voltage signal line VLEDL can be increased by 0.15 mm, and a width of a bent portion of the common voltage signal line GNDL can be increased by 0.25 mm. After the width of the bent portion of the driving voltage signal line VLEDL and the width of the bent portion of the common voltage signal line GND are increased, resistances thereof are decreased, so that heat generated during the working of the light emitting substrate and the temperature rise of the fanout region can be reduced. Through a simulation test, when the width of the driving voltage signal line VLEDL is increased from 0.54 mm to 0.69 mm, and the width of the common voltage signal line GNDL is increased from 0.54 mm to 0.78 mm, the temperature rise of the fanout region can be reduced from 20° C. to 15° C.

In an embodiment, a width of a bent portion GND1 of at least one common voltage signal line GNDL located in the fanout region is in the range of 0.7 mm~1.0 mm. With such configuration, a resistance of the bent portion GND1 of the common voltage signal line GNDL is smaller, so that the bent portion GND1 of the common voltage signal line GNDL generates less heat during the working of the light emitting substrate, which helps to reduce the temperature rise of the fanout region.

In an embodiment, a width of a bent portion VLE1 of at least one driving voltage signal line VLEDL located in the fanout region is in the range of 0.7 mm~1.0 mm. With such configuration, a resistance of the bent portion VLE1 of the driving voltage signal line VLEDL is smaller, and the bent portion VLE1 of the driving voltage signal line VLEDL generates less heat during the working of the light emitting substrate, which helps to reduce the temperature rise of the fanout region.

In an embodiment, the signal lines, the first pads, and the second pads in the light emitting substrate are arranged in a same layer. The signal lines can include the above-described conducting wires, cascaded wirings, driving voltage signal lines VLEDL, address signal lines ADDRL, power signal lines PwrL, common voltage signal lines GNDL, feedback signal lines FBL, and guard rings Guard. It should be noted that a term "A and B are arranged in a same layer" refers to that A and B are located on a surface of a same film layer and both are in direct contact with the surface. In some embodiments, A and B are formed from a same film layer in one patterning process. In some embodiments, A and B are located on a surface of a same film layer and both are in direct contact with the surface, and A and B have substantially a same height or thickness. In another embodiment, the signal lines, the first pads, and the second pads in the light emitting substrate can be located in different layers, for example, distributed in two metal film layers.

An embodiment of the present application provides a method of manufacturing a light emitting substrate. The manufacturing method may include the following steps:

First, a base is provided.

The base may be any suitable substrate such as a plastic substrate, a silicon substrate, a ceramic substrate, a glass substrate, or a quartz substrate. Materials for the base are not limited in the embodiments of the present application.

Subsequently, a conductive film layer is formed on the base, and the conductive film layer is patterned to form a conductive layer, where the conductive layer includes signal lines, first pads, and second pads.

Subsequently, a plurality of driving circuits and a plurality of light emitting elements are mounted on the conductive layer to form a plurality of light emitting units arranged in an array, where each of the light emitting units includes a driving circuit and at least one light emitting element connected with the driving circuit. The signal lines are configured to transmit electrical signals to the driving circuit and the at least one light emitting element in each light emitting unit.

In an embodiment, the conductive film layer can be formed on the base by a magnetron sputtering method or an electroplating method, and the conductive film layer is patterned to simultaneously form the signal lines, the first pads, and the second pads. Since a thickness of a conductive layer obtained by single magnetron sputtering generally does not exceed 1 μm, when a conductive layer with a thickness of more than 1 μm is produced, multiple sputtering is usually required to form the conductive layer. The signal lines can include the above-described conducting wires, cascaded wirings, driving voltage signal lines VLEDL, address signal lines ADDRL, power signal lines PwrL, common voltage signal lines GNDL, feedback signal lines FBL, and guard rings Guard.

In an exemplary embodiment, the process of forming the conductive film layer may include: first, forming a Cu layer with a thickness of, for example, 2 um on the base for transmitting various electrical signals; then, forming a CuNi layer with a thickness of, for example, 0.6 um on the Cu layer for protecting the Cu layer and preventing a surface of the Cu layer with a low resistivity from being exposed and oxidized. In another example, the process of forming the conductive layer may include: first, forming a MoNb layer with a thickness of about 300 Å on the base for improving adhesion of the film layer to the base; then forming a Cu layer on the MoNb layer for transmitting various electrical signals; and finally, forming a MoNb or MoNiTi or CuNi layer with a thickness of about 200 Å on the Cu layer for protecting the intermediate Cu layer and preventing a surface of the intermediate Cu layer with a low resistivity from being exposed and oxidized.

In another embodiment, the conductive film layer can be formed on the base by an electroplating method, and its formation process may include: first, forming a seed layer with MoNiTi for increasing a nucleation density of metal crystal grains in a subsequent electroplating process; then producing a Cu layer with a low resistivity by electroplating; and producing an anti-oxidation layer with a material of MoNiTi. The conductive layer can be subjected to processes such as cleaning, coating, baking, photoetching, developing, hard baking, etching, and stripping to form the signal lines, the first pads and the second pads.

In an embodiment, the method of manufacturing the light emitting substrate further includes: forming a first insulation layer by a magnetron sputtering method on a side of a layer where the conductive layer is located away from the base. The first insulation layer can be used to protect the conductive layer from being oxidized and corroded by water, oxygen, etc. in an environment. Materials for the first insulation layer may include organic materials, inorganic materials, or combinations thereof. The first insulation layer may be a single film layer, or include a plurality of film layers.

In an embodiment, the method of manufacturing the light emitting substrate further includes: coating a second insulation film layer on a side of the first insulation layer away from the base; and curing, exposing, developing, etching and subjecting the second insulation film layer to other processes to form a second insulation layer. Materials for the second insulation layer may include organic materials, inorganic materials, or combinations thereof. The second insulation layer may be a single film layer, or include a plurality of film layers. When the second insulation layer is formed on the light emitting substrate, the second insulation layer and the first insulation layer are etched to form a plurality of via holes.

In an embodiment, the step of mounting the plurality of driving circuits and the plurality of light emitting elements on the conductive layer to form the plurality of light emitting units arranged in an array may include: electrically connecting the driving circuits and the light emitting units with the first pads and the second pads through the plurality of via holes respectively, so as to mount the driving circuits and the light emitting elements on corresponding pads. The signal lines are connected with flexible circuit boards at bonding regions, so as to realize an electrical connection between the driving circuits and the flexible circuit boards. In an embodiment, after the step of mounting the plurality of driving circuits and the plurality of light emitting elements on the conductive layer to form the plurality of light emitting units arranged in an array, the method of manufacturing the light emitting substrate may further include: cutting the light emitting substrate into a predetermined shape to finally obtain a desired light emitting substrate.

In an embodiment, the light emitting substrate is a backlight source, which can be used as a backlight source in a display device to provide a display light source for a display panel in the display device. In other embodiment, the backlight source can be used in any other device that needs a light source. Uses of the backlight source are not specifically limited in the present application.

In an embodiment, the light emitting substrate may be a mini LED light emitting substrate, that is, the light emitting elements are mini LEDs. In another embodiment, the light emitting substrate may be a micro LED light emitting substrate, that is, the light emitting elements are micro LEDs.

An embodiment of the present application further provides a display device. The display device includes any one of the above-described light emitting substrates.

In some embodiments, the display device may be a liquid crystal display device, including a liquid crystal panel, and a backlight source provided on a non-display side of the liquid crystal panel, where the backlight source includes a light emitting substrate described in any one of the above embodiments, which, for example, can be used to implement HDR dimming for display operation. The liquid crystal display device can have more uniform backlight brightness and better display contrast.

In another embodiment, the light emitting substrate in the display device is used as a display substrate. When the light emitting substrate is used as the display substrate, each light emitting element is used as a sub-pixel.

The display device can be any suitable display device, including, but not limited to, any product or component with a display function, such as a mobile phone, a tablet computer, a television, a monitor, a notebook computer, a digital photo frame, a navigator, or an e-book.

It can be understood that FIG. 1 to FIG. 4 in the present application are used only to schematically illustrate connection relationships among driving circuits, light emitting units, signal lines and pads. Sizes of the driving circuits, the light emitting units, the signal lines and the pads are not drawn to scale, and their relative position relationships do not necessarily correspond completely to their actual positions. In the drawings, scales of some regions and layers may be exaggerated for clarity.

It should be pointed out that, in the drawings, sizes of layers and areas may be exaggerated for clarity of illustration. It will also be understood that when an element or layer is referred to as being "on" another element or layer, it can be directly on other element, or an intermediate layer may be present. In addition, it will be understood that when an element or layer is referred to as being "below" another element or layer, it can be directly below other element, or more than one intermediate layer or element may be present. It will also be understood that when a layer or element is referred to as being "between" two layers or elements, it can be the only layer between the two layers or elements, or more than one intermediate layer or element may be present. Similar reference signs indicate similar elements throughout.

Other embodiments of the present application will be readily apparent to those skilled in the art after considering the specification and practicing the contents disclosed herein. The present application is intended to cover any variations, uses, or adaptations of the present application, which follow the general principle of the present application and include common knowledge or conventional technical means in the art that are not disclosed in the present application. The specification and examples are to be regarded as illustrative only. The true scope and spirit of the present application are pointed out by the following claims.

It is to be understood that the present application is not limited to the precise structures that have described and shown in the drawings, and various modifications and changes can be made without departing from the scope thereof. The scope of the application is to be limited only by the appended claims.

The invention claimed is:

1. A light emitting substrate, comprising: a light emitting region and a border region, wherein
  the light emitting substrate comprises a base, and a plurality of light emitting units and a plurality of signal lines located on the base; the light emitting units are located in the light emitting region, and each of the light emitting units comprises a driving circuit and at least one light emitting element connected with the driving circuit; the plurality of light emitting units are arranged into M rows along a first direction and into N columns along a second direction intersecting the first direction, wherein both M and N are positive integers greater than or equal to 1; the plurality of signal lines comprise N target signal lines extending along the first direction; the border region comprises a region of the light emitting substrate located outside a first column of light emitting units, a region of the light emitting substrate located outside an $N^{th}$ column of light emitting units, and a region of the light emitting substrate located outside a first row of light emitting units; and a target signal line for the first column of light emitting units and/or a target signal line for the $N^{th}$ column of light emitting units comprise(s) a first extension section, a connection section and a second extension section connected in sequence; the first extension section is connected with a driving circuit and located in the border region; the first extension section, the connection section and the second extension section enclose a receiving region surrounding at least two groups of light emitting units;

wherein the border region comprises a first border region, a second border region, and a third border region; the first border region and the second border region extend along the first direction and are oppositely arranged; the third border region extends along the second direction; the first border region is the region of the light emitting substrate located outside the first column of light emitting units; the second border region is the region of the light emitting substrate located outside the $N^{th}$ column of light emitting units; the third border region is the region of the light emitting substrate located outside the first row of light emitting units; and the first extension section is located in the second border region or the first border region, the connection section is located in the third border region, and the second extension section is located in the light emitting region, wherein a length of the first extension section is smaller than a length of the second extension section.

2. The light emitting substrate according to claim 1, wherein the border region further comprises a fourth border region arranged oppositely to the third border region; the fourth border region is a region of the light emitting substrate located outside an $M^{th}$ row of light emitting units; and the fourth border region comprises a bonding region; the second extension section is connected with the bonding region.

3. The light emitting substrate according to claim 2, wherein the light emitting region comprises a plurality of sub-light emitting regions arranged along the second direction, and each of the sub-light emitting regions is provided with a plurality of columns of light emitting units; and the bonding region comprises a plurality of sub-bonding regions, and signal lines in one sub-light emitting region are connected with one sub-bonding region.

4. The light emitting substrate according to claim 3, wherein each of the sub-bonding regions is provided with bonding terminals for connection with corresponding sub-light emitting region, and a bonding terminal connected with the second extension section is located between bonding terminals corresponding to two sub-light emitting regions adjacent to a sub-light emitting region where the second extension section is located.

5. The light emitting substrate according to claim 1, wherein the light emitting region comprises a plurality of sub-light emitting regions arranged along the second direction, and each of the sub-light emitting regions is provided with a plurality of columns of light emitting units; driving circuits in one column of light emitting units are connected with one target signal line; and in a sub-light emitting region where the first column of light emitting units is located, each of at least two target signal lines encloses a receiving region surrounding at least two groups of light emitting units; and/or in a sub-light emitting region where the $N^{th}$ column of light emitting units is located, each of at least two target signal lines encloses a receiving region surrounding at least two groups of light emitting units.

6. The light emitting substrate according to claim 1, wherein the light emitting region comprises a plurality of sub-light emitting regions arranged along the second direction, and each of the sub-light emitting regions is provided with X columns of light emitting units, wherein X is an even number; and in a same sub-light emitting region, the second extension section is located between a $(X/2)^{th}$ column of light emitting units and a $(X/2+1)^{th}$ column of light emitting units.

7. The light emitting substrate according to claim 1, wherein the light emitting region comprises a plurality of sub-light emitting regions arranged along the second direction, and each of the sub-light emitting regions is provided with X columns of light emitting units, wherein X is a positive integer greater than or equal to 1; and in each of the sub-light emitting regions, the target signal line for the first column of light emitting units and/or a target signal line for an $X^{th}$ column of light emitting units enclose(s) a receiving region surrounding at least two groups of light emitting units.

8. The light emitting substrate according to claim 7, wherein the border region comprises a fanout region; at least one of the plurality of signal lines comprises a bent portion extending along the first direction, and the bent portion is located in the fanout region; and an orthographic projection of a portion of the second extension section located in the fanout region in the second direction does not overlap an orthographic projection of the bent portion in the second direction.

9. The light emitting substrate according to claim 1, wherein each driving circuit comprises an address terminal and a relay terminal; the address terminal is configured to receive an address signal, and the relay terminal is configured to output a relay signal; respective driving circuits in each column of light emitting units are cascaded in sequence; the address terminal in an $i^{th}$ stage driving circuit is located on a side of the $i^{th}$ stage driving circuit close to an $(i-1)^{th}$ stage driving circuit, and the relay terminal in the $i^{th}$ stage driving circuit is located on a side of the $i^{th}$ stage driving circuit close to an $(i+1)^{th}$ stage driving circuit, wherein $1<i<M$ and i is a positive integer; and the first extension section is connected with the relay terminal of the driving circuit.

10. The light emitting substrate according to claim 1, wherein the light emitting substrate further comprises a guard ring; the guard ring is located in the border region and surrounds a periphery of the light emitting region; and a distance between the connection section and the guard ring in the first direction is greater than or equal to 0.2 mm.

11. The light emitting substrate according to claim 1, wherein the light emitting substrate further comprises N driving voltage signal lines extending along the first direction, and one column of light emitting units is connected with one driving voltage signal line; and for each of the N driving voltage signal lines, spacing between the driving voltage signal line and other adjacent signal line is greater than or equal to 0.2 mm.

12. The light emitting substrate according to claim 1, wherein the target signal lines are feedback signal lines; the second extension section is adjacent to a feedback signal line, and a distance between the second extension section and the adjacent feedback signal line in the second direction is greater than or equal to 0.05 mm.

13. The light emitting substrate according to claim 1, wherein the light emitting substrate further comprises N common voltage signal lines extending along the first direction, and driving circuits in one column of light emitting units are connected with one common voltage signal line; the border region comprises a first border region and a second border region that are oppositely arranged; the first border region is the region of the light emitting substrate located outside the first column of light emitting units; the second border region is the region of the light emitting substrate located outside the $N^{th}$ column of light emitting units; and
a common voltage signal line for the first column of light emitting units or the $N^{th}$ column of light emitting units comprises a first connection portion located in the first border region or the second border region; each driving circuit comprises a plurality of terminals; spacing between a geometric center of a plurality of terminals in a driving circuit in a column of light emitting units corresponding to the first connection portion and the first connection portion in the second direction is greater than or equal to 1.35 mm.

14. The light emitting substrate according to claim 13, wherein the spacing between the geometric center of a plurality of terminals in a driving circuit in a column of light emitting units corresponding to the first connection portion and the first connection portion in the second direction is smaller than a size of light emitting units in the column of light emitting units in the second direction.

15. The light emitting substrate according to claim 1, wherein the light emitting substrate further comprises N common voltage signal lines extending along the first direction, and driving circuits in one column of light emitting units are connected with one common voltage signal line; the border region comprises a first border region and a second border region that are oppositely arranged; the first border region is the region of the light emitting substrate located outside the first column of light emitting units; the second border region is the region of the light emitting substrate located outside the $N^{th}$ column of light emitting units; and
a common voltage signal line for the first column of light emitting units or the $N^{th}$ column of light emitting units comprises a first connection portion located in the first border region or the second border region; and a groove is provided on a side of the first connection portion facing the light emitting region.

16. The light emitting substrate according to claim 1, wherein the light emitting substrate further comprises N driving voltage signal lines extending along the first direction, and driving circuits in one column of light emitting units are connected with one driving voltage signal line; the border region comprises a first border region and a second border region that are oppositely arranged; the first border region is the region of the light emitting substrate located outside the first column of light emitting units; the second border region is the region of the light emitting substrate located outside the $N^{th}$ column of light emitting units; and
a driving voltage signal line for the first column of light emitting units or the $N^{th}$ column of light emitting units comprises a second connection portion located in the first border region or the second border region; and a groove is provided on a side of the second connection portion facing the light emitting region.

17. The light emitting substrate according to claim 1, wherein the target signal lines are feedback signal lines; the plurality of signal lines further comprise driving voltage signal lines, power signal lines, and common voltage signal lines; each driving circuit comprises an address terminal, a relay terminal, a power supply terminal, and a common voltage terminal;
respective driving circuits in each column of light emitting units are cascaded in sequence; the address terminal in an $i^{th}$ stage driving circuit is located on a side of the $i^{th}$ stage driving circuit close to an $(i-1)^{th}$ stage driving circuit, and the relay terminal in the $i^{th}$ stage driving circuit is located on a side of the $i^{th}$ stage driving circuit close to an $(i+1)^{th}$ stage driving circuit, wherein $1<i<M$ and i is a positive integer; the first extension section of a feedback signal line is connected with the relay terminal in a last stage driving circuit; and
in the second direction, for a column of light emitting units and signal lines connected with the column of light emitting units, a driving voltage signal line, light emitting elements, driving circuits, a power signal line, and a common voltage signal line are arranged in sequence.

18. The light emitting substrate according to claim 1, wherein the border region comprises a fourth border region extending along the second direction; the fourth border region is a region of the light emitting substrate located outside an $M^{th}$ row of light emitting units; the fourth border region comprises a plurality of sub-bonding regions; the light emitting region comprises a plurality of sub-light emitting regions, and each of the sub-light emitting regions is provided with a plurality of columns of light emitting units; signal lines in one sub-light emitting region are connected with bonding terminals in a same sub-bonding region; the bonding terminals in the same sub-bonding region are connected with a flexible circuit board.

19. A display device, comprising a light emitting substrate comprising a light emitting region and a border region, wherein
the light emitting substrate comprises a base, and a plurality of light emitting units and a plurality of signal lines located on the base; the light emitting units are located in the light emitting region, and each of the light emitting units comprises a driving circuit and at least one light emitting element connected with the driving circuit; the plurality of light emitting units are arranged into M rows along a first direction and into N columns along a second direction intersecting the first direction, wherein both M and N are positive integers greater than or equal to 1; the plurality of signal lines comprise N target signal lines extending along the first direction; the border region comprises a region of the light emitting substrate located outside a first column of light emitting units, a region of the light emitting substrate located outside an $N^{th}$ column of light emitting units, and a region of the light emitting substrate located outside a first row of light emitting units; and
a target signal line for the first column of light emitting units and/or a target signal line for the $N^{th}$ column of light emitting units comprise(s) a first extension section, a connection section and a second extension section connected in sequence; the first extension section is connected with a driving circuit and located in the border region; the first extension section, the connection section and the second extension section enclose a receiving region surrounding at least two groups of light emitting units;

wherein the border region comprises a first border region, a second border region, and a third border region; the first border region and the second border region extend along the first direction and are oppositely arranged; the third border region extends along the second direction; the first border region is the region of the light emitting substrate located outside the first column of light emitting units; the second border region is the region of the light emitting substrate located outside the $N^{th}$ column of light emitting units; the third border region is the region of the light emitting substrate located outside the first row of light emitting units; and the first extension section is located in the second border region or the first border region, the connection section is located in the third border region, and the second extension section is located in the light emitting region, wherein a length of the first extension section is smaller than a length of the second extension section.

20. A light emitting substrate, comprising: a light emitting region and a border region, wherein the light emitting substrate comprises a base, and a plurality of light emitting units and a plurality of signal lines located on the base; the light emitting units are located in the light emitting region, and each of the light emitting units comprises a driving circuit and at least one light emitting element connected with the driving circuit; the plurality of light emitting units are arranged into M rows along a first direction and into N columns along a second direction intersecting the first direction, wherein both M and N are positive integers greater than or equal to 1; the plurality of signal lines comprise N target signal lines extending along the first direction; the border region comprises a region of the light emitting substrate located outside a first column of light emitting units, a region of the light emitting substrate located outside an $N^{th}$ column of light emitting units, and a region of the light emitting substrate located outside a first row of light emitting units; and a target signal line for the first column of light emitting units and/or a target signal line for the $N^{th}$ column of light emitting units comprise(s) a first extension section, a connection section and a second extension section connected in sequence; the first extension section is connected with a driving circuit and located in the border region; the first extension section, the connection section and the second extension section enclose a receiving region surrounding at least two groups of light emitting units;

wherein each driving circuit comprises an address terminal and a relay terminal; the address terminal is configured to receive an address signal, and the relay terminal is configured to output a relay signal; respective driving circuits in each column of light emitting units are cascaded in sequence; the address terminal in an $i^{th}$ stage driving circuit is located on a side of the $i^{th}$ stage driving circuit close to an $(i-1)^{th}$ stage driving circuit, and the relay terminal in the $i^{th}$ stage driving circuit is located on a side of the $i^{th}$ stage driving circuit close to an $(i+1)^{th}$ stage driving circuit, wherein $1<i<M$ and i is a positive integer; and the first extension section is connected with the relay terminal of the driving circuit.

* * * * *